US012667016B2

(12) United States Patent    (10) Patent No.:    US 12,667,016 B2

Yue    (45) Date of Patent:    Jun. 23, 2026

---

(54) MICRO PACKAGE STRUCTURE

(71) Applicant: Hue Inc., Shanghai (CN)

(72) Inventor: Yang Yue, Shanghai (CN)

(73) Assignee: Hue Inc., Shanghai (CN)

( * ) Notice: Subject to any disclaimer, the term of this patent is extended or adjusted under 35 U.S.C. 154(b) by 330 days.

(21) Appl. No.: 18/203,906

(22) Filed: May 31, 2023

(65) Prior Publication Data

US 2023/0395584 A1    Dec. 7, 2023

(30) Foreign Application Priority Data

Jun. 2, 2022    (WO) ................ PCT/CN2022/096930

(51) Int. Cl.
| | |
|---|---|
| *H10W 72/90* | (2026.01) |
| *H10K 50/842* | (2023.01) |
| *H10K 59/80* | (2023.01) |
| *H10W 72/50* | (2026.01) |
| *H10W 90/00* | (2026.01) |

(52) U.S. Cl.
CPC ........ *H10W 90/00* (2026.01); *H10K 50/8426* (2023.02); *H10K 59/8722* (2023.02); *H10W 72/5445* (2026.01); *H10W 72/932* (2026.01); *H10W 72/936* (2026.01); *H10W 90/754* (2026.01)

(58) Field of Classification Search
CPC ........ H01L 25/167; H01L 2924/12041; H01H 2219/014; H05K 2201/10106; H04N 1/02845; H04N 1/0288; H10K 50/8426; H10K 59/8722; H10K 39/10; H10K 59/90; H10K 59/95; H10B 80/00; H10N 19/00; H10N 39/00; H10N 59/00; H10N 69/00; H10N 79/00; H10N 89/00; H10H 20/00–882; H10H 29/00–142; H10H 29/30–962
See application file for complete search history.

(56) References Cited

U.S. PATENT DOCUMENTS

| | | | | |
|---|---|---|---|---|
| 7,019,718 | B2 * | 3/2006 | Yamazaki | ............. G02F 1/1345 |
| | | | | 345/80 |
| 7,916,263 | B2 * | 3/2011 | Kimura | ............... G02F 1/13452 |
| | | | | 349/151 |
| 2005/0023956 | A1 * | 2/2005 | Kwak | ................ H10K 59/1315 |
| | | | | 313/497 |
| 2009/0072385 | A1 * | 3/2009 | Alley | ...................... H01L 24/17 |
| | | | | 257/713 |
| 2011/0062846 | A1 * | 3/2011 | Song | ...................... C08L 83/04 |
| | | | | 445/24 |
| 2018/0031879 | A1 * | 2/2018 | Siddiqui | ........... H10K 59/8722 |

(Continued)

FOREIGN PATENT DOCUMENTS

WO    WO 2019/086903 A1    5/2019

*Primary Examiner* — Wael M Fahmy
*Assistant Examiner* — Thomas Wilson McCoy
(74) *Attorney, Agent, or Firm* — FINNEGAN, HENDERSON, FARABOW, GARRETT & DUNNER LLP

(57)    ABSTRACT

A micro package structure includes a micro LED panel including an IC (integrated circuit) substrate and an micro LED array area formed on the IC substrate; a top cover plane formed above the micro LED panel, so that light emitted from the micro LED array area is transmitted upward to the top cover plane; and a seal structure formed between an edge of the micro LED panel and an edge of the top cover plane around the micro LED array area.

17 Claims, 4 Drawing Sheets

(56)             References Cited

U.S. PATENT DOCUMENTS

2019/0132963 A1*  5/2019  Yu .......................... H10K 50/84
2020/0258867 A1      8/2020  Harrold et al.
2022/0123088 A1*  4/2022  Shi ....................... G09G 3/3225

* cited by examiner

100

MICRO PACKAGE STRUCTURE

CROSS-REFERENCE TO RELATED APPLICATIONS

The present disclosure claims priority to and the benefits of PCT Application No. PCT/CN2022/096930, filed on Jun. 2, 2022, which is incorporated herein by reference in its entirety.

TECHNICAL FIELD

The present disclosure generally relates to light emitting diode technology, and more particularly, to a micro package structure.

BACKGROUND

Micro LEDs with extra smaller area and higher resolution are increasingly popular in the world. A micro LED panel with a micro LED array can be used to form various kinds of devices, such as camera module, projection modules, display modules, VR/AR optical modules, and so on.

The micro LED panel includes an image display area and a non-functional area. The image display area displays an objective image which is displayed by the micro LED array. The non-functional area includes multiple signal metal pads and dummy metal, which includes metal materials. A conventional package structure of the micro LED panel includes a cover plane adhesive on the micro LED panel. A part of light emitted from the image display area will be reflected back to the micro LED panel and to the non-functional area, and then the metal materials will reflect the light again toward the outside. For example, some light is reflected by the non-functional area toward the outside from the side of the image display area, the sidewall of the cover plane and the gap between the cover plane and the micro LED panel, thereby producing a virtual incomplete image around the objective image, which decreases the image quality.

SUMMARY OF THE DISCLOSURE

Embodiments of the present disclosure provide a micro package structure. The micro package structure includes a micro LED panel including an IC (integrated circuit) substrate and an micro LED array area formed on the IC substrate; a top cover plane formed above the micro LED panel, so that light emitted from the micro LED array area is transmitted upward to the top cover plane; and a seal structure formed between an edge of the micro LED panel and an edge of the top cover plane around the micro LED array area.

BRIEF DESCRIPTION OF THE DRAWINGS

Embodiments and various aspects of the present disclosure are illustrated in the following detailed description and the accompanying figures. Various features shown in the figures are not drawn to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. Particular aspects of the present disclosure are described in greater detail below. The terms and definitions provided herein control, if in conflict with terms and/or definitions incorporated by reference.

Figure 1:
FIG. 1 illustrates a structural diagram showing a side sectional view of an exemplary micro package structure, according to some embodiments of the present disclosure.

FIG. 1 illustrates a structural diagram showing a side sectional view of an exemplary micro package structure 100 of a micro LED panel 130, according to some embodiments of the present disclosure. As shown in FIG. 1, the micro package structure 100 includes the micro LED panel 130, a top cover plane 140, and a seal structure 150. The micro LED panel 130 includes a micro LED array area 132 and an IC (integrated circuit) substrate 131. The micro LED array area 132 is located on the IC substrate 131 to form an image display area of the micro LED panel 130. The rest of the area on the IC substrate 131 not covered by the micro LED array area 132 is formed as a non-functional area. The top cover plane 140 is provided above the micro LED panel 130 and supported by the seal structure 150. The top cover plane 140 covers the image display area (e.g., the micro LED array area 132) and at least part of the non-function area. Therefore, the light emitted from the image display area transmits upward to the top cover plane 140. The seal structure 150 is formed between an edge of the micro LED panel 130 and an edge of the top cover plane 140. It can be understood that the seal structure 150 forms a closed area on the micro LED panel 130 (more specifically, on the IC substrate 131), and surrounds the image display area (e.g., the micro LED array area 132). In some embodiments, an outer sidewall of the seal structure 150 is aligned with a sidewall of the top cover plane 140 in a vertical direction. In some embodiments, the micro LED panel 130 is a self-emitting micro LED display panel.

With this micro package structure 100 of a micro LED panel, the seal structure 150 can prevent light emitting from the image display area to outside through a gap between the top cover plane 140 and the micro LED panel 130.

In some embodiments, a distance between the top cover plane 140 and the micro LED panel 130 (e.g., a distance between a bottom surface of the top cover plane 140 and a top surface of the micro LED array area 132) is not greater than a thickness of the micro LED panel 130. For example, the thickness of the micro LED panel 130 is 500 μm to 5 mm. In some embodiments, the distance between the top cover plane 140 and the micro LED panel 130 (e.g., a distance between a bottom surface of the top cover plane 140 and a top surface of the micro LED array area 132) is not greater than a thickness of the top cover plane 140. For example, the thickness of the top cover plane 140 is not greater than 1500 μm. More specifically, the thickness of the top cover plane 140 is in a range of 200 μm to 1500 μm. In some embodiments, the distance between the top cover plane 140 and the micro LED panel 130 is as same the thickness of the top cover plane 140. For example, the distance between the top cover plane 140 and the micro LED panel 130 is in a range of 200 μm to 1500 μm. In some embodiments, a distance between the top cover plane 140 and the micro LED panel 130 is in a range of 3 μm to 5 μm. In some embodiments, the top cover plane 140 is transparent. For example, the material of top cover plane 140 can be organic glass or inorganic glass.

In some embodiments, the seal structure 150 is formed on the non-function area of the micro LED panel 130. That is, the seal structure 150 connects the IC substrate 131 and the top cover plane 140. A height of the seal structure can be equal to the distance between the top cover plane 140 and the non-functional area (e.g., a top of the IC substrate 131). In some embodiments, the seal structure 150 can include light absorption material, such as a combination of film forming agent composed of resin and polymer and light sensitive sensitizer. The light absorption material can include a film forming agent. The film forming agent can include one or more of resin, polymer, light-sensitive sensitizer, or a combination thereof. With the light absorption material, the seal structure 150 can further absorb the light emitted from the image display area, so as to improve the image quality.

In some embodiments, the seal structure 150 can include sealant 151 and a plurality of spacers 152. The seal structure 150 can be a combination of the sealant 151 and the plurality of spacers 152. The material of the sealant 151 can comprise one or more of a resin and a polymer. For example, the resin can be an epoxy resin, and the polymer can be silicone. The spacers 152 can be small balls with a same diameter. Since the sealant 151 is flowable, the top cover plane 140 can be pressed downwards as close as possible to the micro LED panel 130. Therefore, a diameter of the ball can define a height of the seal structure 150, in another word, the distance between the top cover plane 140 and the non-functional area (e.g., a top of the IC substrate 131). Using such seal structure 150, the distance between the top cover plane 140 and the micro LED panel 130 can be efficiently guaranteed or adjusted according to the thickness of the spacers 152 (e.g., the diameter of the balls).

In some embodiments, the micro package structure 100 can further include a support base plane formed under the bottom of micro LED panel 130. The support base plane is rigid, so as to provide a stable base of the micro LED panel 130.

Figure 2:
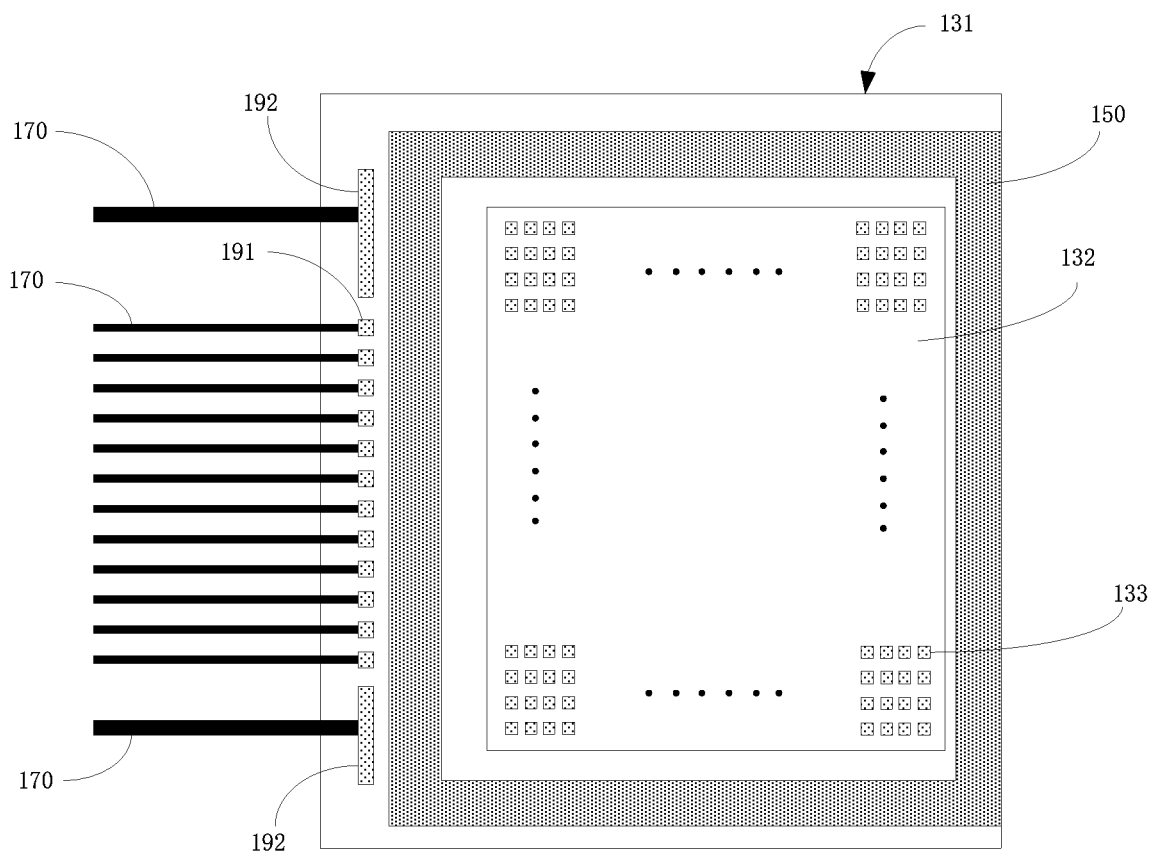
FIG. 2 illustrates a structural diagram showing a top view of the micro package structure shown in FIG. 1, according to some embodiments of the present disclosure.
Figure 3:
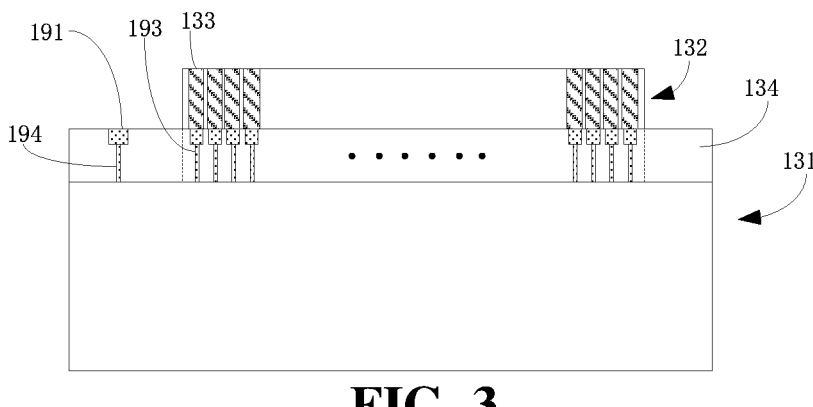
FIG. 3 illustrates a structural diagram showing a side sectional view of a micro LED panel shown in FIG. 1, according to some embodiments of the present disclosure.

FIG. 2 illustrates a structural diagram showing a top view of the micro package structure shown in FIG. 1, according to some embodiments of the present disclosure. FIG. 3 illustrates a structural diagram showing a side sectional view of the micro LED panel shown in FIG. 1, according to some embodiments of the present disclosure. Referring to FIG. 2 and FIG. 3, the micro LED panel 130 further includes a micro LED array area 132 and an IC substrate 131 which is formed at the bottom of the micro LED array area 132 with an extruded part extending outside of the micro LED array area 132. The micro LED array area 132 forms the image display area, and the extruded part of the IC substrate 131 forms the non-functional area. The micro LED array area 132 further includes a plurality of micro LEDs 133 which are provided in an array. A plurality of signal metal pads and dummy metal can be further formed on a surface of the non-functional area. The signal metal pads can include a plurality of IO (input/output) metal pads 191 and a plurality of dummy metal pads 192.

The IO metal pads 191 can conductively connect to the IC substrate 131. The micro LEDs 133 in the micro LED array area 132 are connected with the IC substrate 131 by a plurality of first metal connected holes 193, respectively. That is, every micro LED 133 is connected with the IC substrate 131 by one first metal connected hole 193. Respective tops of the first metal connected holes 193 are connected with the micro LEDs 133 one-to-one. Accordingly, the plurality of first metal connected holes 193 correspond to the plurality of micro LED 133. As shown in FIG. 2, the first metal connected holes 193 are formed in an array which is the same as the micro LED array, and the first metal connected holes 193 are formed as a first connected area on the IC substrate 131, which corresponds to the micro LED array area (e.g., the image display area). Bottom of the signal metal pads, i.e., the IO metal pads 191 and the dummy metal pads 192, are connected with the IC substrate 131 by a plurality of second metal connected holes 194. Bottoms of the second metal connected holes 194 of the IO metal pads 191 are conductively connected with bottoms of the first metal connected holes 193. Therefore, the IO metal pads 191 can conductively connect with the micro LEDs 133 through the second metal connected holes 194, the IC substrate 131, and the first metal connected holes 193. The bottoms of the second metal connected holes 194 of the dummy metal pads 192 are conductively connected with the top electrodes of the micro LEDs 133. The second metal connected holes 194 are formed as a second connected area on the non-functional area. The second connected area is away from the first connected area, and closed to the edge of the IC substrate 131. In some embodiments, the first connected area refers as to an inside connected area, and the second connected area refers as to an external connected area. The first metal connected holes 193 and the second metal connected holes 194 are formed in a top layer 134 of the IC substrate 131. It is noted that, the IC substrate 131 can further include a conventional metal interconnected multilayer to connect the IO metal pads 191 for each micro LED 133. The metal interconnected multilayer can be understood by those skilled in the art, which will not be described herein.

Referring to FIG. 1 and FIG. 2, since the seal structure 150 is formed on the non-functional area, the first connected area and the second connected area are further separated by the seal structure 150. For example, the second connected area is formed between the seal structure 150 and the edge of the IC substrate 131. The second connected area is not covered by the seal structure 150. As shown in FIG. 2, the IO metal pads 191 are formed on the second connected area in a one-dimensional array (e.g., in a line). At least some of the dummy metal pads 192 are formed on the second connected area, which are arranged in a one-dimensional array. In some embodiment, all of the dummy metal pads 192 and the IO metal pads 191 are formed on the second connected area.

Referring to FIG. 1 and FIG. 2, the micro package structure 100 further includes bonding wires 170. The bonding wires 170 connect the signal metal pads such as the IO metal pads 191 and the dummy metal pads 192 on the second connected area with an external circuit. Therefore, the IC substrate 131 and the micro LEDs 133 in the micro LED array area 132 can be conductively connected with the external circuit by the bonding wires 170. Since only the signal metal pads on the second connected area are used to connect with the external circuit, interference of the IO metal pads 191 can be decreased and external design can be facilitated.

Referring back to FIG. 1, in some embodiments, the micro package structure 100 further includes a protective layer 180. The protective layer 180 is formed on a surface of the second connected area and covers around a surface of the bonding wires 170, so as to protect the connection between the second connected area and the external circuit. The bonding wires 170 can be also be protected by the protective layer 180. In some embodiments, a top of the protective layer 180 is lower than a top of the top cover plane 140. Therefore, the protective layer 180 cannot contact the top cover plane 140. Furthermore, the top of the protective layer 180 is lower than a top of the micro LED array area 132. The material of the protective layer 180 can include resin and polymer. For example, the resin is epoxy resin, and the polymer is silicone. In some embodiments, a sidewall of the protective layer 180 connects to a sidewall of the seal structure 150. Therefore, the protective layer 180 and the seal structure 150 are connected, and there is no non-functional area exposed between the protective layer 180 and the seal structure 150.

In some embodiments, the micro package structure 100 further includes an external circuit plane 120. The external circuit is formed on the external circuit plane 120. The external circuit plane 120 is formed at the bottom of the micro LED panel 130 with an extruded part extending outside of the micro LED panel 130. The protective layer 180 is further formed on the surface of the extruded part of the external circuit plane 120. In some embodiments, a support base plane 110 is further formed under the bottom of the external circuit plane 120. The support base plane 110 is rigid, so as to provide a stable base of the micro LED panel 130 and the external circuit plane 120.

In some embodiments, the external circuit plane 120 is formed outside of the bottom of the micro LED panel 130, surrounding the micro LED panel 130. That is, the external circuit plane 120 and the micro LED panel 130 are integrated in a same plane. Therefore, the micro package structure 100 can be more compact. The protective layer 180 is further formed on the part of the external circuit plane 120.

In this example, the support base plane 110 can be formed under the external circuit plane 120 and the micro LED panel 130.

Figure 4:
FIG. 4 illustrates a structural diagram showing a side sectional view of another exemplary micro package structure, according to some embodiments of the present disclosure.
Figure 5:
FIG. 5 illustrates a structural diagram showing a top view of the micro package structure shown in FIG. 4, according to some embodiments of the present disclosure.
Figure 6:
FIG. 6 illustrates a structural diagram showing a side sectional view of a variation of the exemplary micro package structure shown in FIG. 4, according to some embodiments of the present disclosure.
Figure 7:
FIG. 7 illustrates a structural diagram showing a side sectional view of another variation of the exemplary micro package structure shown in FIG. 4, according to some embodiments of the present disclosure.

FIG. 4 to FIG. 8 illustrate structural diagrams showing variations of another exemplary micro package structure, according to some embodiments of the present disclosure. Referring to FIG. 4 to FIG. 8, a micro package structure 400 includes a micro LED panel 430, a top cover plane 440, and a light shielding layer 460. The micro LED panel 430 includes a micro LED array area 432 and an IC substrate 431. The micro LED array area 432 is located on the IC substrate 431 to form an image display area of the micro LED panel 430. The rest of the area on the IC substrate 431 not covered by the micro LED array area 432 is formed as a non-functional area. The top cover plane 440 is formed above the micro LED panel 430. Light emitted from the image display area transmits upward to the top cover plane 440. The light shielding layer 460 is formed on an edge surface of the top cover plane 440. It can be understood that the light shielding layer 460 extends along the perimeter of the top cover plane 440. The light shielding layer 460 can be formed on a top edge surface of the top cover plane 440 (as shown in FIG. 4) or on a bottom edge surface of the top cover plane 440 (as shown in FIG. 7). A projection of the light shielding layer 460 in a vertical direction on the micro LED panel 430 covers at least part of the non-functional area. FIG. 5 illustrates a structural diagram showing a top view of the micro package structure 400 of the micro LED panel shown in FIG. 4 or FIG. 6, according to some embodiments of the present disclosure. As shown in FIG. 5, viewed from the top, the light shielding layer 460 forms around the top cover plane 440, and covers at least part of the non-function area, exposing the image display area. A shape of the light shielding layer 460 is a closed geometric structure at least exposing the image display area, such as a rectangular frame, a circular frame, an elliptical frame, or any other geometric shape. The shape of the light shielding layer 460 shown in FIG. 5 is a rectangular with an opening at least exposing the image display area. In some embodiments, since the image display area (e.g., the micro LED array area 432) may not be located at a center of the micro LED panel 430, a center of the opening (e.g., a center of the display area or a center of the micro LED array area 432) is not aligned with a center of the top cover plane 440.

Therefore, light emitted from the image display area transmitting to the top cover plane 440 where the light shielding layer 460 is formed cannot be reflected back to the micro LED panel 430, so as to improve the image quality.

In some embodiments, the projection area of the light shielding layer 460 on the non-functional area covers the IO metal pads and the dummy metal pads. Therefore, there is no light reflected back on the IO metal pads and the dummy metal pads, or further reflected by the IO metal pads and the dummy metal pads outwards from the micro LED panel 430. In some embodiments, the projection area of the light shielding layer 460 on the non-functional area further covers the dummy metal that is formed on the non-functional area, so as to prevent the reflection by the dummy metal.

In some embodiments, an outside edge of the light shielding layer 460 is aligned with the sidewall of the top cover plane 440 in a vertical direction. That means the light shielding layer 460 extends to the furthest edge of the top cover plane 440. In some embodiments, an inside edge of the light shielding layer 460 is aligned with a sidewall of the image display area in the vertical direction. Therefore, the projection area of the light shielding layer 460 on the micro LED panel 430 covers the non-functional area as much as possible. Furthermore, the projection area of the light shielding layer 460 on the micro LED panel 430 covers the whole non-functional area.

In some embodiments, the light shielding layer 460 is an anti-reflection coating layer. Specifically, the material of the light shielding layer is black photo resist. The thickness of the light shielding layer 460 is not greater than half of the thickness of the top cover plane 440. For example, the thickness of the light shielding layer 460 is in a range of 0.3 μm to 5 μm. The light shielding layer 460 can be a spinning coat on the top cover plane 440. That is, the light shielding layer 460 is spun coated on the top cover plane 440.

In some embodiments, as shown in FIG. 4, the light shielding layer 460 is formed on a top edge surface of the top cover plane 440. Since the top cover plane 440 is transparent, the light shielding layer 460 on the top edge surface can also prevent reflecting of the transmitted light. FIG. 6 illustrates a structural diagram showing a side sectional view of another variation of the exemplary micro package structure 200 of a micro LED panel, according to some embodiments of the present disclosure. As shown in FIG. 6, the light shielding layer 460 is further formed on the sidewall of the top cover plane 440 so as to further prevent the light emitted from the image display area from reflecting by the sidewall of the top cover plane 440. The image quality is thereby further improved.

As shown in FIG. 4 and FIG. 6, the micro package structure 400 can further includes a seal structure 450. The seal structure 450 is formed between the top surface of the non-functional area and a bottom surface of the top cover plane 440, thereby a closed space is formed between the micro LED panel 430 and the top cover plane 440 around the image display area. In some embodiments, a distance between the micro LED panel 430 and the top cover plane 440 is not greater than a thickness of the micro LED panel 430 or a thickness of the top cover plane 440. A height of the seal structure 450 is equal to a distance between the non-functional area (e.g., a top of the IC substrate 431) and the top cover plane 440 because of a thickness of the light shielding layer 460.

Figure 8:
FIG. 8 illustrates a structural diagram showing a side sectional view of another a variation of the exemplary micro package structure shown in FIG. 4, according to some embodiments of the present disclosure.

FIG. 7 illustrates a structural diagram showing a side sectional view of another variation of the exemplary micro package structure 400 of a micro LED panel, according to some embodiments of the present disclosure. As shown in FIG. 7, the light shielding layer 460 is formed on a bottom edge surface of the top cover plane 440. A projection of the light shielding layer 460 in a vertical direction covers at least part of the non-functional area. FIG. 8 illustrates a structural diagram showing a side sectional view of another variation of the exemplary micro package structure 400 of a micro LED panel 430, according to some embodiments of the present disclosure. As shown in FIG. 8, the light shielding layer 460 is formed on a bottom edge surface of the top cover plane 440, and further formed on a sidewall of the top cover panel 440.

As shown in FIG. 7 and FIG. 8, the micro package structure 400 can further includes the seal structure 450. The seal structure 450 is formed between the top surface of the non-functional area and a bottom surface of the light shielding layer 460 to form a closed space between the micro LED panel 430 and the top cover plane 440 around the image display area. In some embodiments, a distance between the micro LED panel 430 and the top cover plane 440 is not greater than a thickness of the micro LED panel 430 or a thickness of the top cover plane 440. A height of the seal structure 450 is less than the distance between the non-functional area (e.g., a top of the IC substrate 431) and the top cover plane 440 because of a thickness of the light shielding layer 460.

In some embodiments, an anti-reflection material can be integrated at the edge of the top cover plane to form a light shielding layer integrated with the top cover plane.

As shown in FIG. 4 to FIG. 8, the micro package structure 400 can further include a support base plane 410, an external circuit panel 420, one or more bonding wires 470, and a protective layer 480. Further details regarding the support base plane 410, the external circuit panel 420, the seal structure 450, the bonding wires 470, the protective layer 480, and the signal metal pads can be found by referring to the description of the embodiment shown in FIG. 1, which will not be further described here.

Figure 9:
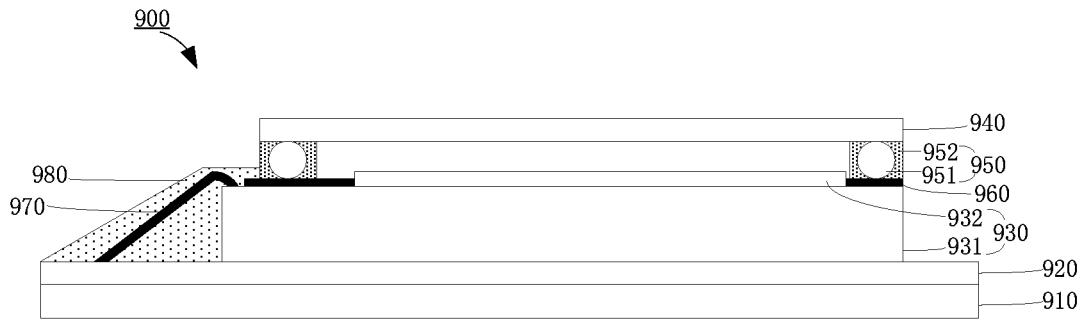
FIG. 9 illustrates a structural diagram showing a side sectional view of another exemplary micro package structure, according to some embodiments of the present disclosure.
Figure 10:
FIG. 10 illustrates a structural diagram showing a top view of the micro package structure shown in FIG. 9, according to some embodiments of the present disclosure.
Figure 11:
FIG. 11 illustrates a structural diagram showing a side sectional view of a variation of the exemplary micro package structure shown in FIG. 9, according to some embodiments of the present disclosure.

FIG. 9 to FIG. 11 illustrate structural diagrams showing variations of another exemplary micro package structure, according to some embodiments of the present disclosure. Referring to FIG. 9 to FIG. 11, a micro package structure 900 includes a micro LED panel 930, a top cover plane 940, and a light shielding layer 960. The micro LED panel 930 includes a micro LED array area 932 and an IC substrate 931. The micro LED array area 932 is located on the IC substrate 931 to form an image display area of the micro LED panel 930. The rest of the area on the IC substrate 931 not covered by the micro LED array area 932 is formed as a non-functional area. The light shielding layer 960 is formed on at least part of the surface of the non-functional area. Therefore, the light emitted from the image display area and reflected by the top cover panel 940 to the non-functional area cannot be reflected again. In some embodiments, a top of the light shielding layer 960 is lower than a top of the micro LED panel 930 (e.g., a top of the micro LED array area 932).

In some embodiments, IO metal pads are further formed on the surface of the non-function area, and the light shielding layer 960 covers the IO metal pads. Therefore, the light reflected to the non-functional area cannot be reflected by the IO metal pads again, so as to improve the micro LED panel quality.

In some embodiments, a dummy metal is further formed on the surface of the non-functional area, and the light shielding layer 960 further covers the dummy metal. In some embodiments, the light shielding layer 960 covers the whole non-functional area.

In some embodiments, an outside edge of the light shielding layer 960 is aligned with a part of the sidewall of the micro LED panel 930 in a vertical direction. Furthermore, the outside edge of the light shielding layer 960 is aligned with a part of the non-functional area in a vertical direction. In some embodiments, the light shielding layer 960 covers the non-functional area except for one edge surface exposed for connecting the bonding wires 970. In some embodiments, an inside edge of the light shielding layer 960 is aligned with the sidewall of the image display area in a vertical direction. That is, the light shielding layer 960 contacts the micro LED array area 932. Therefore, the light shielding layer 960 covers the non-functional area as much as possible.

FIG. 10 illustrates a structural diagram showing a top view of the micro package structure shown in FIG. 9, according to some embodiments of the present disclosure. As shown in FIG. 10, viewed from the top, the light shielding layer 960 is formed on the non-functional area of the IC substrate 931, exposing the image display area. A shape of the light shielding layer 960 is a closed geometric structure at least exposing the image display area, such as a rectangular frame, a circular frame, an elliptical frame, or any other geometric shape. The shape of the light shielding layer 960 shown in FIG. 10 is rectangular with an opening at least exposing the image display area.

In some embodiments, the light shielding layer 960 is an anti-reflection coating layer. Specifically, the material of the light shielding layer is black photo resist. The thickness of the light shielding layer 960 is not greater than half of the thickness of the top cover plane 940. For example, the thickness of the light shielding layer 960 is in a range of 0.3 μm to 5 μm.

In some embodiments, the micro package structure 900 can further include a seal structure 950. The seal structure 950 is formed between the top surface of the light shielding layer 960 and a bottom surface of the edge of the top cover plane 940 around the image display area to form a closed space between the micro LED panel 930 and the top cover plane 940 around the image display area. In some embodiments, a distance between the micro LED panel 930 and the top cover plane 940 is not greater than a thickness of the micro LED panel 930 or a thickness of the top cover plane 940. A height of the seal structure 950 is less than the distance between the non-functional area (e.g., a top of the IC substrate 931) and the top cover plane 940 because of a thickness of the light shielding layer 960.

FIG. 11 illustrates a structural diagram showing a side sectional view of another variation of the exemplary micro package structure 900 of a micro LED panel, according to some embodiments of the present disclosure. As shown in FIG. 11, the light shielding layer 960 can be further formed on a sidewall of the top cover panel 940.

As shown in FIG. 9 to FIG. 11, the micro package structure 900 can further include a support base plane 910, an external circuit panel 920, one or more bonding wires 970, and a protective layer 980. Further details regarding the support base plane 910, the external circuit panel 920, the seal structure 950, the bonding wires 970, the protective layer 980, and the signal metal pads can be found by referring to the description of the embodiment shown in FIG. 1, which will not be further described here.

The embodiments may further be described using the following clauses:

1. A micro package structure, comprising:

a micro LED panel comprising an IC (integrated circuit) substrate and an micro LED array area formed on the IC substrate;

a top cover plane formed above the micro LED panel, so that light emitted from the micro LED array area is transmitted upward to the top cover plane; and a seal structure formed between an edge of the micro LED panel and an edge of the top cover plane around the micro LED array area.

2. The micro package structure according to clause 1, wherein the IC substrate comprises a non-functional area around the micro LED array area; and the seal structure is formed on a surface of the non-functional area.

3. The micro package structure according to clause 2, wherein a distance between the micro LED panel and the top cover plane is not greater than a thickness of the micro LED panel or a thickness of the top cover plane.

4. The micro package structure according to clause 3, wherein a height of the seal structure is equal to a distance between the non-functional area and the top cover plane.

5. The micro package structure according to clause 3 or 4, wherein the distance between the micro LED panel and the top cover plane is in a range of 3 μm to 25 μm.

6. The micro package structure according to any one of clauses 1 to 5, wherein the seal structure comprises a light absorption material.

7. The micro package structure according to clause 6, wherein the light absorption material comprises a film forming agent.

8. The micro package structure according to clause 7, wherein the film forming agent comprises one or more of resin, polymer, or light-sensitive sensitizer.

9. The micro package structure according to any one of clauses 1 to 5, wherein the seal structure further comprises a sealant and a plurality of spacers between the micro LED panel and the top cover plane.

10. The micro package structure according to clause 9, wherein the sealant and the plurality of spacers are mixed.

11. The micro package structure according to clause 9 or 10, wherein a material of the sealant comprises a resin and a polymer.

12. The micro package structure according to clause 11, wherein the resin is epoxy resin and the polymer is silicone.

13. The micro package structure according to any one of clauses 1 to 12, wherein a sidewall of the seal structure is aligned with a sidewall of the top cover plane in a vertical direction.

14. The micro package structure according to any one of clauses 2 to 13, further comprising a plurality of signal metal pads formed on a surface of the non-functional area.

15. The micro package structure according to clause 14, further comprising a dummy metal formed on the surface of the non-functional area.

16. The micro package structure according to clause 14 or 15, further comprising one or more bonding wires to connect the signal metal pads with an external circuit.

17. The micro package structure according to clause 16, wherein the non-functional area comprises a connected area; the plurality of signal metal pads comprise a plurality of IO (input/output) metal pads and a plurality of dummy metal pads; and all of the IO metal pads and at least some of the dummy metal pads are formed on the connected area.

18. The micro package structure according to clause 17, further comprising a protective layer formed on a surface of the connected area and covering around a surface of the one or more bonding wires.

19. The micro package structure according to clause 18, further comprising an external circuit plane formed at a bottom of the micro LED panel with an extruded part extending outside of the micro LED panel.

20. The micro package structure according to clause 19, wherein the protective layer is further formed on a surface of the extruded part of the external circuit plane.

21. The micro package structure according to clause 19 or 20, further comprising a support base plane formed at a bottom of the external circuit plane.

22. The micro package structure according to clause 21, wherein the support base plane is rigid.

23. The micro package structure according to clause 18, further comprising an external circuit plane formed extending outside of a bottom of the micro LED panel.

24. The micro package structure according to clause 23, wherein the protective layer is further formed on a part of the external circuit plane.

25. The micro package structure according to clause 23 or 24, further comprising a support base plane formed at a bottom surface of the micro LED panel and the external circuit plane.

26. The micro package structure according to clause 25, wherein the support base plane is rigid.

27. The micro package structure according to clause 18, wherein a top of the protective layer is lower than a top of the top cover plane.

28. The micro package structure according to clause 27, wherein the top of the protective layer is further lower than a top of the micro LED array area.

29. The micro package structure according to clause 18, wherein a material of the protective layer comprises a resin and a polymer.

30. The micro package structure according to clause 29, wherein the resin is epoxy resin and the polymer is silicone.

31. The micro package structure according to clause 18, wherein a sidewall of the protective layer connects a sidewall of the seal structure.

32. The micro package structure according to any one of clauses 1 to 31, wherein the top cover plane is transparent.

33. The micro package structure according to clause 32, wherein a material of the top cover plane is organic glass or inorganic glass.

34. The micro package structure according to clause 32 or 33, wherein a thickness of the top cover plane is not greater than a thickness of the micro LED panel.

35. The micro package structure according to clause 32 or 33, wherein a thickness of the top cover plane is not greater than 1500 μm.

36. The micro package structure according to clause 35, wherein the thickness of the top cover plane is in a range of 200 μm to 1500 μm.

37. The micro package structure according to any one of clauses 1 to 18, further comprising a support base plane formed at a bottom of the micro LED panel.

38. A micro package structure, comprising:
a micro LED panel comprising an IC (integrated circuit) substrate and an micro LED array area formed on the IC substrate;
a top cover plane formed above the micro LED panel, so that light emitted from the micro LED array area is transmitted upward to the top cover plane; and
a light shielding layer formed on an edge surface of the top cover plane.

39. The micro package structure according to clause 38, wherein the IC substrate comprises a non-functional area around the micro LED array area; and the light shielding layer is formed above the non-functional area, and a projection of the light shielding layer on the micro LED panel covers at least part of the non-functional area.

40. The micro package structure according to clause 39, further comprising a plurality of IO (input/output) metal pads formed on a surface of the non-functional area, and the projection of the light shielding layer on the micro LED panel covers the IO metal pads.

41. The micro package structure according to clause 39, further comprising a dummy metal formed on a surface of the non-functional area; and the projection of the light shielding layer on the micro LED panel further covers the dummy metal.

42. The micro package structure according to any one of clauses 39 to 41, wherein an outside edge of the light shielding layer is aligned with a sidewall of the top cover plane in the vertical direction.

43. The micro package structure according to clause 42, wherein an inside edge of the light shielding layer is aligned with a sidewall of the micro LED array area in the vertical direction.

44. The micro package structure according to any one of clauses 39 to 43, wherein the projection of the light shielding layer on the micro LED panel further covers whole non-functional area.

45. The micro package structure according to any one of clauses 39 to 44, wherein a shape of the light shielding layer is rectangular with an opening at least exposing the micro LED array area.

46. The micro package structure according to any one of clauses 39 to 45, wherein a shape of the light shielding layer is rectangular with an opening at least exposing the micro LED array area and a part of the non-functional area.

47. The micro package structure according to any one of clauses 38 to 46, wherein a thickness of the light shielding layer is not greater than half of a thickness of the top cover plane.

48. The micro package structure according to clause 47, wherein the thickness of the light shielding layer is in a range of 0.3 μm to 5 μm.

49. The micro package structure according to any one of clauses 38 to 48, wherein the light shielding layer is an anti-reflection coating layer.

50. The micro package structure according to clause 49, wherein a material of the light shielding layer is black photo resist.

51. The micro package structure according to any one of clauses 39 to 50, further comprising a seal structure formed between a top surface of the non-functional area vertically below the light shielding layer and the top cover plane, thereby forming a closed space between the micro LED panel and the top cover plane around the micro LED array area.

52. The micro package structure according to clause 51, wherein a distance between the micro LED panel and the top cover plane is not greater than a thickness of the micro LED panel or a thickness of the top cover plane.

53. The micro package structure according to clause 52, wherein a height of the seal structure is equal to a distance between the non-functional area and the top cover plane.

54. The micro package structure according to clause 52 or 53, wherein the distance between the micro LED panel and the top cover plane is in a range of 3 μm to 25 μm.

55. The micro package structure according to any one of clauses 51 to 54, wherein the seal structure comprises a light absorption material.

56. The micro package structure according to clause 55, wherein the light absorption material comprises a combination of a film forming agent.

57. The micro package structure according to clause 56, wherein the film forming agent comprises one or more of resin, polymer, or light-sensitive sensitizer.

58. The micro package structure according to any one of clauses 51 to 54, wherein the seal structure further comprises a sealant and a plurality of spacers between the micro LED panel and the top cover plane.

59. The micro package structure according to clause 58, wherein the sealant and the plurality of spacers are mixed.

60. The micro package structure according to clause 58 or 59, wherein a material of the sealant comprises a resin and a polymer.

61. The micro package structure according to clause 60, wherein the resin is epoxy resin and the polymer is silicone.

62. The micro package structure according to any one of clauses 39 to 61, wherein the light shielding layer is formed on a top edge surface of the top cover plane.

63. The micro package structure according to clause 62, wherein the light shielding layer is further formed on a sidewall of the top cover plane.

64. The micro package structure according to any one of clauses 39 to 61, wherein the light shielding layer is formed on a top edge surface of the top cover plane.

65. The micro package structure according to clause 64, wherein the light shielding layer is further formed on a sidewall of the top cover plane.

66. A micro package structure, comprising:
a micro LED panel comprising an IC (integrated circuit) substrate and an micro LED array area formed on the IC substrate, wherein the IC substrate comprises a non-functional area around the micro LED array area;
a top cover plane formed above the micro LED panel, so that light emitted from the micro LED array area is transmitted upward to the top cover plane; and
a light shielding layer formed on at least part of a surface of the non-functional area.

67. The micro package structure according to clause 66, further comprising a plurality of IO (input/output) metal pads formed on a surface of the non-functional area, and the light shielding layer covers the IO metal pads.

68. The micro package structure according to clause 67, further comprising a dummy metal formed on the surface of the non-functional area, the light shielding layer further covering the dummy metal.

69. The micro package structure according to any one of clauses 66 to 68, wherein the light shielding layer covers whole non-functional area.

70. The micro package structure according to any one of clauses 66 to 68, wherein an outside edge of the light shielding layer is aligned with a part of a sidewall of the micro LED panel in a vertical direction.

71. The micro package structure according to clause 70, wherein the outside edge of the light shielding layer is aligned with a sidewall of the non-functional area in the vertical direction.

72. The micro package structure according to clause 70 or 71, wherein an inside edge of the light shielding layer is aligned with a sidewall of the micro LED array area in the vertical direction.

73. The micro package structure according to any one of clauses 66 to 72, wherein a shape of the light shielding layer is rectangular with an opening at least exposing the micro LED array area.

74. The micro package structure according to any one of clauses 66 to 72, wherein a shape of the light shielding layer is rectangular with an opening at least exposing the micro LED array area and a part of the non-functional area.

75. The micro package structure according to any one of clauses 66 to 72, wherein the light shielding layer covers the non-functional area except for one edge surface exposed.

76. The micro package structure according to any one of clauses 66 to 75, wherein a top of the light shielding layer is lower than a top of the micro LED panel.

77. The micro package structure according to any one of clauses 66 to 76, wherein the light shielding layer is an anti-reflection coating layer.

78. The micro package structure according to clause 77, wherein a material of the light shielding layer is black photo resist.

79. The micro package structure according to any one of clauses 66 to 78, wherein a thickness of the light shielding layer is in a range of 0.3 μm to 5 μm.

80. The micro package structure according to any one of clauses 66 to 79, further comprising a seal structure formed between the top surface of the light shielding layer and a bottom surface of the edge of the top cover plane around the micro LED array area, thereby forming a closed space between the micro LED panel and the top cover plane around the micro LED array area.

81. The micro package structure according to clause 80, wherein a distance between the micro LED panel and the top cover plane is not greater than a thickness of the micro LED panel or a thickness of the top cover plane.

82. The micro package structure according to clause 81, wherein a height of the seal structure is less than a distance between the non-functional area and the top cover plane.

83. The micro package structure according to any one of clauses 80 to 82, wherein the seal structure comprises a light absorption material.

84. The micro package structure according to clause 83, wherein the light absorption material comprises a combination of a film forming agent.

85. The micro package structure according to clause 84, wherein the film forming agent comprises one or more of resin, polymer, or light-sensitive sensitizer.

86. The micro package structure according to any one of clauses 80 to 83, wherein the seal structure further comprises a sealant and a plurality of spacers between the micro LED panel and the top cover plane.

87. The micro package structure according to clause 86, wherein the sealant and the plurality of spacers are mixed.

88. The micro package structure according to clause 87, wherein a material of the sealant comprises a resin and a polymer.

89. The micro package structure according to clause 88, wherein the resin is epoxy resin and the polymer is silicone.

90. The micro package structure according to any one of clauses 66 to 89, wherein the light shielding layer is further formed on a sidewall of the top cover plane.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

In the drawings and specification, there have been disclosed exemplary embodiments. However, many variations and modifications can be made to these embodiments. Accordingly, although specific terms are employed, they are used in a generic and descriptive sense only and not for purposes of limitation.

What is claimed is:

1. A micro package structure, comprising:
a micro LED panel comprising an IC (integrated circuit) substrate and a micro LED array area formed on the IC substrate;
a top cover plane formed above the micro LED panel, wherein light emitted from the micro LED array area is transmitted upward to the top cover plane; and
a seal structure formed on the micro LED panel and below the top cover plane surrounding the micro LED array area;
wherein the IC substrate comprises a non-functional area around the micro LED array area, the seal structure formed on a surface of the non-functional area, and the micro package structure further comprises a plurality of signal metal pads formed on a surface of the non-functional area; and
wherein the non-functional area comprises a connected area, the plurality of signal metal pads comprise a plurality of IO (input/output) metal pads and a plurality of dummy metal pads, and all of the IO metal pads and at least some of the dummy metal pads are formed on the connected area.

2. The micro package structure according to claim 1, wherein a distance between the micro LED panel and the top cover plane is not greater than a thickness of the micro LED panel or a thickness of the top cover plane.

3. The micro package structure according to claim 2, wherein a height of the seal structure is equal to a distance between the non-functional area and the top cover plane.

4. The micro package structure according to claim 2, wherein the distance between the micro LED panel and the top cover plane is in a range of 3 $\mu$m to 25 $\mu$m.

5. The micro package structure according to claim 1, wherein the seal structure comprises a light absorption material.

6. The micro package structure according to claim 5, wherein the light absorption material comprises a film forming agent.

7. The micro package structure according to claim 6, wherein the film forming agent comprises one or more of resin, polymer, or light-sensitive sensitizer.

8. The micro package structure according to claim 1, wherein the seal structure further comprises a sealant and a plurality of spacers between the micro LED panel and the top cover plane.

9. The micro package structure according to claim 8, wherein the sealant and the plurality of spacers are mixed.

10. The micro package structure according to claim 8, wherein a material of the sealant comprises a resin and a polymer.

11. The micro package structure according to claim 10, wherein the resin is epoxy resin and the polymer is silicone.

12. The micro package structure according to claim 1, wherein a sidewall of the seal structure is aligned with a sidewall of the top cover plane in a vertical direction.

13. The micro package structure according to claim 1, further comprising a dummy metal formed on the surface of the non-functional area.

14. The micro package structure according to claim 1, further comprising one or more bonding wires to connect the signal metal pads with an external circuit.

15. The micro package structure according to claim 1, further comprising one or more bonding wires to connect the signal metal pads with an external circuit, and a protective layer formed on a surface of the connected area and covering around a surface of the one or more bonding wires.

16. The micro package structure according to claim 15, further comprising an external circuit plane formed at a bottom of the micro LED panel with an extruded part extending outside of the micro LED panel.

17. The micro package structure according to claim 16, wherein the protective layer is further formed on a surface of the extruded part of the external circuit plane.

* * * * *